US010777384B2

(12) United States Patent
Kikuiri et al.

(10) Patent No.: US 10,777,384 B2
(45) Date of Patent: Sep. 15, 2020

(54) MULTIPLE BEAM IMAGE ACQUISITION APPARATUS AND MULTIPLE BEAM IMAGE ACQUISITION METHOD

(71) Applicant: NuFlare Technology, Inc., Yokohama-shi (JP)

(72) Inventors: Nobutaka Kikuiri, Koganei (JP); Atsushi Ando, Edogawa-ku (JP)

(73) Assignee: NuFlare Technology, Inc., Yokohama-shi (JP)

( * ) Notice: Subject to any disclaimer, the term of this patent is extended or adjusted under 35 U.S.C. 154(b) by 0 days.

(21) Appl. No.: 16/199,444

(22) Filed: Nov. 26, 2018

(65) Prior Publication Data
US 2019/0195815 A1   Jun. 27, 2019

(30) Foreign Application Priority Data
Dec. 22, 2017  (JP) ................... 2017-245903

(51) Int. Cl.
*H01J 37/28*  (2006.01)
*H01J 37/244*  (2006.01)
(Continued)

(52) U.S. Cl.
CPC ............ *H01J 37/28* (2013.01); *H01J 37/244* (2013.01); *G01N 23/2251* (2013.01);
(Continued)

(58) Field of Classification Search
CPC .. H01J 37/28; H01J 37/04; H01J 37/20; H01J 2237/0453; H01J 37/244
See application file for complete search history.

(56) References Cited

U.S. PATENT DOCUMENTS 8,330,103 B2 * 12/2012 Enyama ................. H01J 37/28
                                                       250/306
9,666,405 B1 *  5/2017 Lanio .................... H01J 37/244
(Continued)

FOREIGN PATENT DOCUMENTS

JP            2009-9882         1/2009

*Primary Examiner* — Wyatt A Stoffa
(74) *Attorney, Agent, or Firm* — Oblon, McClelland, Maier & Neustadt, L.L.P.

(57) ABSTRACT

A multiple beam image acquisition apparatus includes a stage to mount thereon a target object, a beam forming mechanism to form multiple primary electron beams and a measurement primary electron beam, a primary electron optical system to collectively irradiate the target object surface with the multiple primary electron beams and the measurement primary electron beam, a secondary electron optical system to collectively guide multiple secondary electron beams generated because the target object is irradiated with the multiple primary electron beams, and a measurement secondary electron beam generated because the target object is irradiated with the measurement primary electron beam, a multi-detector to detect the multiple secondary electron beams collectively guided, a measurement mechanism to measure a position of the measurement secondary electron beam collectively guided, and a correction mechanism to correct a trajectory of the multiple secondary electron beams by using a measured position of the measurement secondary electron beam.

10 Claims, 7 Drawing Sheets

(51) Int. Cl.
    *G01N 23/2251*    (2018.01)
    *H01J 37/20*    (2006.01)
    *H01J 37/04*    (2006.01)

(52) U.S. Cl.
    CPC .............. *H01J 37/04* (2013.01); *H01J 37/20* (2013.01); *H01J 2237/0453* (2013.01); *H01J 2237/2816* (2013.01); *H01J 2237/2817* (2013.01); *H01J 2237/3045* (2013.01)

(56) References Cited

U.S. PATENT DOCUMENTS

| | | | |
|---|---|---|---|
| 10,312,052 B2* | 6/2019 | Kruit ..................... | H01J 37/28 |
| 2004/0075054 A1* | 4/2004 | Knippelmeyer ........ | H01J 37/28 |
| | | | 250/310 |
| 2006/0289804 A1* | 12/2006 | Knippelmeyer .... | H01J 37/3177 |
| | | | 250/492.22 |
| 2009/0001267 A1* | 1/2009 | Enyama ................ | H01J 37/28 |
| | | | 250/310 |
| 2009/0114818 A1* | 5/2009 | Casares ................ | H01J 37/147 |
| | | | 250/307 |
| 2010/0065753 A1* | 3/2010 | Enyama .............. | H01J 37/1472 |
| | | | 250/397 |
| 2010/0320382 A1* | 12/2010 | Almogy ................ | H01J 37/147 |
| | | | 250/307 |

* cited by examiner

MULTIPLE BEAM IMAGE ACQUISITION APPARATUS AND MULTIPLE BEAM IMAGE ACQUISITION METHOD

CROSS-REFERENCE TO RELATED APPLICATION

This application is based upon and claims the benefit of priority from prior Japanese Patent Application No. 2017-245903 filed on Dec. 22, 2017 in Japan, the entire contents of which are incorporated herein by reference.

BACKGROUND OF THE INVENTION

Field of the Invention

Embodiments of the present invention relate to a multiple beam image acquisition apparatus and a multiple beam image acquisition method. For example, embodiments of the present invention relate to a method for correcting positional deviation between a multi-detector for acquiring an inspection image by using multiple beams and a secondary electron beam to be detected.

Description of Related Art

In recent years, with the advance of high integration and large capacity of LSI (Large Scale Integration or Integrated circuits), the line width (critical dimension) required for circuits of semiconductor elements is becoming increasingly narrower. Such semiconductor elements are manufactured by forming a circuit by way of exposing and transferring a pattern onto a wafer, utilizing a reduced projection exposure apparatus known as a stepper, while using an original or "master" pattern (also called a mask or a reticle, hereinafter generically referred to as a mask) with a circuit pattern formed thereon.

Since LSI manufacturing requires a tremendous amount of manufacturing cost, it is crucial to improve its yield. However, as typified by a 1-gigabit DRAM (Dynamic Random Access Memory), the scale of patterns configuring the LSI has become on the order of nanometers from submicrons. Also, in recent years, with miniaturization of dimensions of LSI patterns formed on a semiconductor wafer, dimension to be detected as a pattern defect has become extremely small. Therefore, the pattern inspection apparatus which inspects defects of ultrafine patterns transferred and exposed on the semiconductor wafer needs to be highly accurate. Further, one of major factors that decrease the yield of the LSI manufacturing is due to pattern defects on the mask used for exposing and transferring an ultrafine pattern on a semiconductor wafer by the photolithography technology. Therefore, the pattern inspection apparatus which inspects defects on a transfer mask used in manufacturing LSI needs to be highly accurate.

As an inspection method, there is known a method of comparing a measured image captured by imaging a pattern formed on the substrate, such as a semiconductor wafer and a lithography mask, with design data or with another measured image obtained by imaging an identical pattern on the substrate. For example, the methods described below are known as pattern inspection, "die-to-die inspection" and "die-to-database inspection": the "die-to-die inspection" method compares data of measured images obtained by imaging identical patterns at different positions on the same substrate; and the "die-to-database inspection" method generates design image data (reference image), based on pattern design data, to be compared with a measured image serving as measured data obtained by imaging a pattern. In such inspection methods for use in the inspection apparatus, inspection is performed due to that an inspection substrate is placed on the stage so that the target object may be scanned with a light flux along with the stage movement. Specifically, the substrate to be inspected is irradiated with a light flux from the light source through the illumination optical system. A light transmitted through the inspection substrate or reflected therefrom forms an image on a sensor through the optical system. Then, the image obtained by the sensor is transmitted as measured data to the comparison circuit. After providing alignment between images, the comparison circuit compares the measured data with the reference data in accordance with an appropriate algorithm, and determines that there is a pattern defect if the compared data are not identical.

In addition to the pattern inspection apparatus described above which acquires an optical image by irradiating the inspection substrate with laser beams in order to obtain a transmission image or a reflection image of a pattern formed on the substrate, there has been developed an inspection apparatus which acquires a pattern image by scanning the inspection substrate with electron beams and detecting secondary electrons emitted from the inspection substrate due to the irradiation by the electron beams. Further, with respect to the inspection apparatus using electron beams, the apparatus using multiple beams has also been developed. In the multiple beam inspection apparatus, since it is necessary to detect a plurality of secondary electron beams at a time, a plurality of detectors are needed (e.g., refer to Japanese Patent Application Laid-open (JP-A) No. 2009-009882). For example, it is effective to use a multi-detector of multiple pixels. In the multiple beam inspection apparatus, there are disposed a main column in which the primary electron optical system for guiding multiple primary electron beams to the surface of the target object is provided/installed, and a subcolumn in which the secondary electron optical system for guiding multiple secondary electron beams emitted from the target object surface to the multi-detector is provided/installed. In the installation environment of the multiple beam inspection apparatus, if disturbance (interference) arises, deviation occurs in the trajectory of the multiple primary electron beams and/or the multiple secondary electron beams. Due to the trajectory deviation, error may be generated at the position of the multiple secondary electron beams detected by the multi-detector. Thus, there is a problem in that distortion and/or gray scale variation may occur in an acquired image. Consequently, it becomes difficult to perform inspection with great precision. This problem may similarly occur in the apparatus at large which acquires an image by using multiple beams as well as in the inspection apparatus.

BRIEF SUMMARY OF THE INVENTION

According to one aspect of the present invention, a multiple beam image acquisition apparatus includes a stage configured to mount thereon a target object, a beam forming mechanism configured to form multiple primary electron beams and a measurement primary electron beam, a primary electron optical system configured to collectively irradiate a surface of the target object with the multiple primary electron beams and the measurement primary electron beam, a secondary electron optical system configured to collectively guide multiple secondary electron beams generated because the target object is irradiated with the multiple primary electron beams, and a measurement secondary electron beam generated because the target object is irradiated with the measurement primary electron beam, a multi-detector configured to detect the multiple secondary electron beams collectively guided, a measurement mechanism configured to measure a position of the measurement secondary electron beam collectively guided, and a correction mechanism configured to correct a trajectory of the multiple secondary electron beams by using a measured position of the measurement secondary electron beam.

According to another aspect of the present invention, a multiple beam image acquisition method includes forming multiple primary electron beams and a measurement primary electron beam, irradiating collectively a surface of a target object with the multiple primary electron beams and the measurement primary electron beam, guiding collectively multiple secondary electron beams generated because the target object is irradiated with the multiple primary electron beams, and a measurement secondary electron beam generated because the target object is irradiated with the measurement primary electron beam, measuring a position of the measurement secondary electron beam collectively guided, correcting a trajectory of the multiple secondary electron beams by using a measured position of the measurement secondary electron beam, and detecting, by a multi-detector, the multiple secondary electron beams which have been collectively guided and whose trajectory has been corrected.

DETAILED DESCRIPTION OF THE INVENTION

Embodiments below describe an apparatus and method that can perform highly precise detection by a multi-detector when acquiring an image by using multiple beams.

Moreover, embodiments below describe, as an example of the method of taking an image (acquiring an inspection image) of a pattern formed on the inspection substrate, the case where the inspection substrate is irradiated with multiple electron beams in order to obtain a secondary electron image.

First Embodiment

Figure 1:
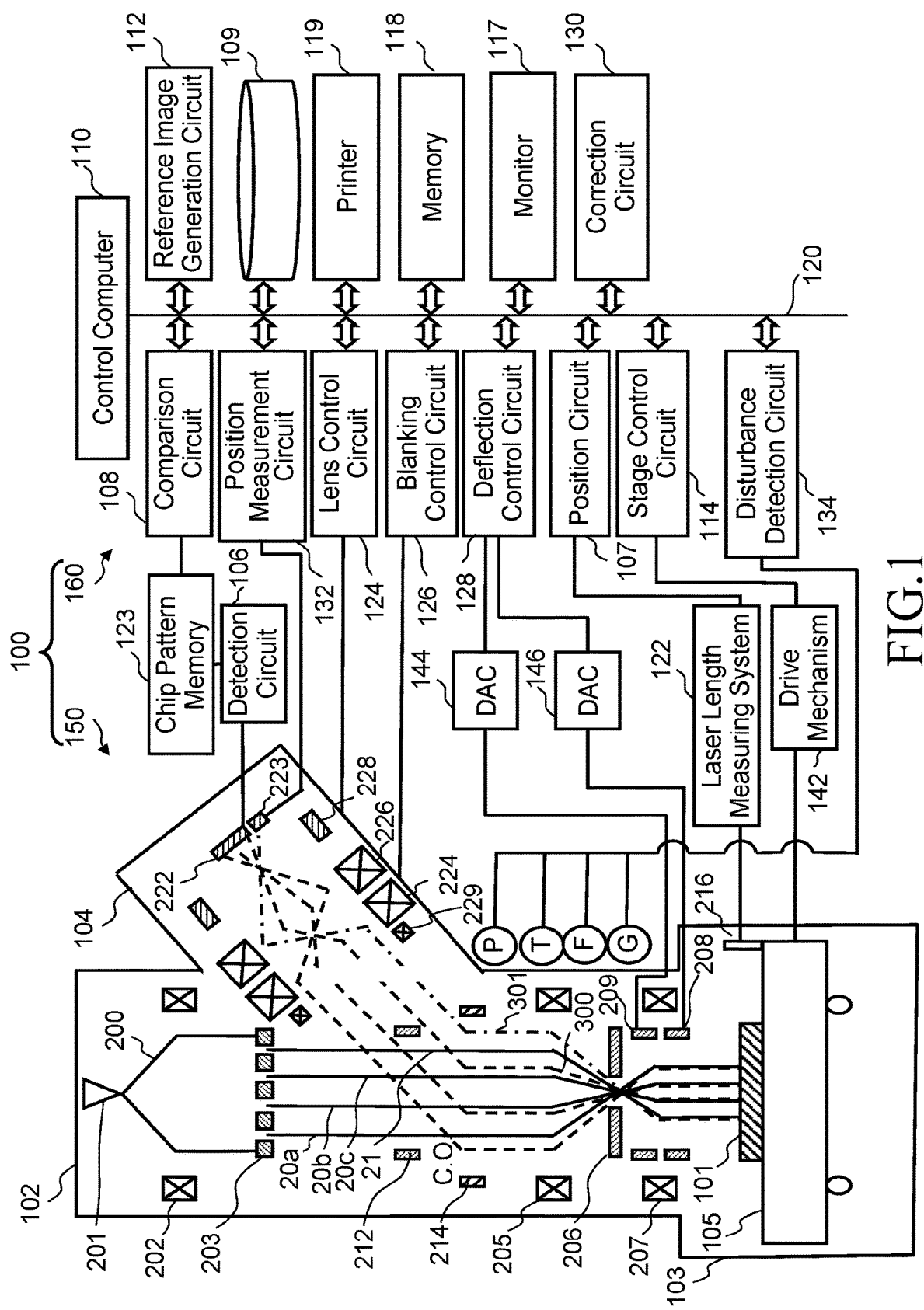
FIG. 1 shows a configuration of a pattern inspection apparatus according to a first embodiment.

FIG. 1 shows a configuration of a pattern inspection apparatus according to a first embodiment. In FIG. 1, an inspection apparatus 100 for inspecting patterns formed on the substrate is an example of an electron beam inspection apparatus. The inspection apparatus 100 is an example of a multiple beam image acquisition apparatus. The inspection apparatus 100 includes an image acquisition mechanism 150 and a control system circuit 160 (control system). The image acquisition mechanism 150 includes a main electron beam column 102, a sub electron beam column 104, an inspection chamber 103, a detection circuit 106, a chip pattern memory 123, a stage drive mechanism 142, and a laser length measuring system 122. In the main electron beam column 102, there are arranged an electron gun 201, an illumination lens 202, a shaping aperture array substrate 203, a reducing lens 205, a limiting aperture substrate 206, an objective lens 207, a main deflector 208, a sub deflector 209, a common blanking deflector 212, and a beam separator 214. In the sub electron beam column 104, there are arranged projection lenses 224 and 226, a deflector 228, a multi-detector 222, a position detector 223, and an alignment coil 229. The primary electron optical system is composed of the reducing lens 205, the limiting aperture substrate 206, the objective lens 207, the main deflector 208, the sub deflector 209, and the common blanking deflector 212. However, the structure of the primary electron optical system is not limited thereto. Other optical elements, etc. may also be arranged. The secondary electron optical system is composed of the beam separator 214 and the projection lenses 224 and 226. However, the structure of the secondary electron optical system is not limited thereto. Other optical elements, etc. may also be arranged.

In the inspection chamber 103, there is arranged an XY stage 105 movable at least in the x-y plane. On the XY stage 105, there is placed a substrate 101 (target object) to be inspected. The substrate 101 may be an exposure mask substrate, or a semiconductor substrate such as a silicon wafer. When the substrate 101 is a semiconductor substrate, a plurality of chip patterns (wafer die) are formed on the semiconductor substrate. When the substrate 101 is an exposure mask substrate, a chip pattern is formed on the exposure mask substrate. The chip pattern is composed of a plurality of figure patterns. If a chip pattern formed on the exposure mask substrate is exposed (transferred) onto the semiconductor substrate a plurality of times, a plurality of chip patterns (wafer die) are formed on the semiconductor substrate. Hereinafter, the case of the substrate 101 being a semiconductor substrate is mainly described below. The substrate 101 is placed with its pattern forming surface facing upward, on the XY stage 105, for example. Moreover, on the XY stage 105, there is arranged a mirror 216 which reflects a laser beam for measuring a laser length emitted from the laser length measuring system 122 disposed outside the inspection chamber 103. The multi-detector 222 is connected, at the outside of the sub electron beam column 104, to the detection circuit 106. The detection circuit 106 is connected to the chip pattern memory 123.

In the control system circuit 160, a control computer 110 which controls the whole of the inspection apparatus 100 is connected, through a bus 120, to a position circuit 107, a comparison circuit 108, a reference image generation circuit 112, a stage control circuit 114, a lens control circuit 124, a blanking control circuit 126, a deflection control circuit 128, a correction circuit 130, a position measurement circuit 132, a disturbance detection circuit 134, a storage device 109 such as a magnetic disk drive, a monitor 117, a memory 118, and a printer 119. The deflection control circuit 128 is connected to DAC (digital-to-analog conversion) amplifiers 144 and 146. The DAC amplifier 146 is connected to the main deflector 208, and the DAC amplifier 144 is connected to the sub deflector 209. Moreover, around the main electron beam column 102, the sub electron beam column 104, or the inspection chamber 103, there are disposed a manometer P, a thermometer T, a vibrometer F, and/or a magnetometer G for detecting disturbance of the installation environment, such as an atmospheric pressure, temperature, vibration and/or magnetic field. The manometer P, the thermometer T, the vibrometer F and/or the magnetometer G are connected to the disturbance detection circuit 134. The position detector 223 is connected, at the outside of the sub electron beam column 104, to the position measurement circuit 132.

The chip pattern memory 123 is connected to the comparison circuit 108. The XY stage 105 is driven by the drive mechanism 142 under the control of the stage control circuit 114. In the drive mechanism 142, the XY stage 105 can be moved by a drive system, such as a three (x-, y-, and θ-) axis motor, for example, which moves in the directions of x, y, and θ. For example, a step motor can be used as each of these X, Y, and θ motors (not shown). The XY stage 105 is movable in the horizontal direction and the rotation direction by the motors of the X-axis, Y-axis, and θ-axis. The movement position of the XY stage 105 is measured by the laser length measuring system 122, and supplied (transmitted) to the position circuit 107. Based on the principle of laser interferometry, the laser length measuring system. 122 measures the position of the XY stage 105 by receiving a reflected light from the mirror 216.

To the electron gun 201, there is connected a high voltage power supply circuit (not shown). The high voltage power supply circuit applies an acceleration voltage between the filament and the extraction electrode (anode) (which are not shown) in the electron gun 201. In addition to applying the acceleration voltage as described above, by applying a voltage to the extraction electrode (Wehnelt) and heating the cathode at a predetermined temperature, electrons emitted from the cathode are accelerated and emitted as an electron beam 200. For example, electromagnetic lenses are used as the illumination lens 202, the reducing lens 205, the objective lens 207, and the projection lenses 224 and 226, and all of them are controlled by the lens control circuit 124. The beam separator 214 is also controlled by the lens control circuit 124. Each of the common blanking deflector 212 and the deflector 228 is composed of electrodes of at least two poles, and controlled by the blanking control circuit 126. Each of the main deflector 208 and the sub deflector 209 is composed of electrodes of at least four poles. The main deflector 208 is controlled by the deflection control circuit 128 through the DAC amplifier 146 disposed for each electrode. The sub deflector 209 is controlled by the deflection control circuit 128 through the DAC amplifier 144 disposed for each electrode.

FIG. 1 shows configuration elements necessary for describing the first embodiment. It should be understood that other configuration elements generally necessary for the inspection apparatus 100 may also be included therein.

Figure 2:
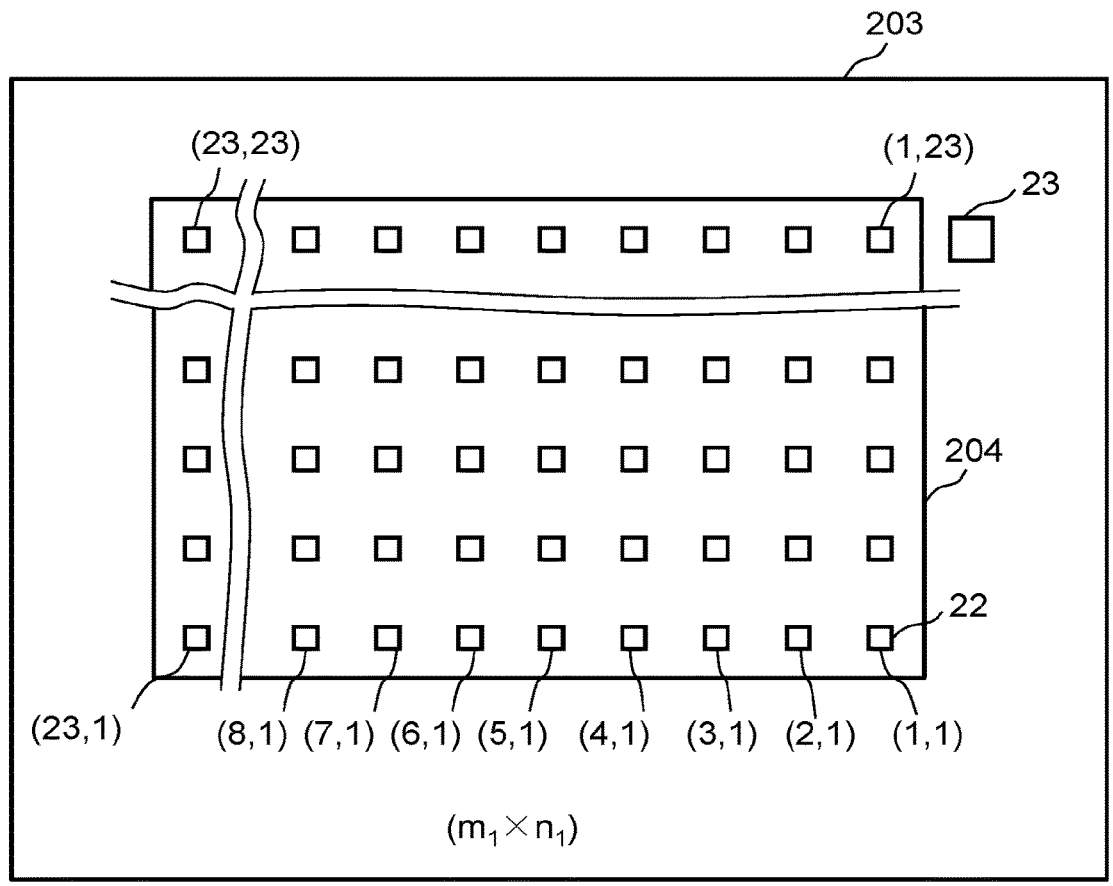
FIG. 2 is a conceptual diagram showing a configuration of a shaping aperture array substrate according to the first embodiment.
Figure 2:
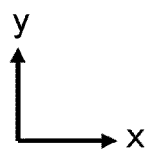

FIG. 2 is a conceptual diagram showing a configuration of a shaping aperture array substrate according to the first embodiment. As shown in FIG. 2, holes (openings) 22 of $m_1$ columns wide (x direction) and $n_1$ rows long (y direction) are two-dimensionally formed in the x and y directions in a multi-beam forming region at a predetermined arrangement pitch in the shaping aperture array substrate 203, where $m_1$ and $n_1$ are integers of 2 or greater. In the case of FIG. 2, holes 22 of 23 (columns in x direction)×23 (rows in y direction) are formed. For example, each of the holes 22 is a quadrangle (rectangle) having the same dimension, shape, and size. Alternatively, each of the holes 22 may be a circle with the same outer diameter. Alternatively, the holes 22 may have different sizes, such as a hole at the center side having a larger size than that of another hole at the outer side due to considering the influence of aberration. The multiple beams 20 (multiple primary electron beams) for image acquisition are formed by letting portions of the electron beam 200 individually pass through a corresponding one of a plurality of holes 22. Here, the case in which the holes 22 of two or more rows and columns are arranged in both the x and y directions is shown, but the arrangement is not limited thereto. For example, it is also acceptable that a plurality of holes 22 are arranged in only one row (x direction) or in only one column (y direction). That is, in the case of only one row, a plurality of holes 22 are arranged in the x direction as a plurality of columns, and in the case of only one column, a plurality of holes 22 are arranged in the y direction as a plurality of rows. The method of arranging the holes 22 is not limited to the case of FIG. 2 where holes are arranged like a grid in the width and length directions. For example, with respect to the k-th and the (k+1)th rows which are arrayed in the length direction (y direction) and each of which is in the x direction, each hole in the k-th row and each hole in the (k+1)th row may be mutually displaced in the width direction (x direction) by a dimension "a". Similarly, with respect to the (k+1)th and the (k+2)th rows which are arrayed in the length direction (y direction) and each of which is in the x direction, each hole in the (k+1)th row and each hole in the (k+2)th row may be mutually displaced in the width direction (x direction) by a dimension "b". As long as a plurality of beams are formed at a time, other arrangement (positional) relation may be allowed.

Moreover, in the shaping aperture array substrate 203, a hole (opening) 23 for position measurement is formed outside a plurality of holes 22 arranged dimensionally. The hole 23 is formed to be rectangular. Alternatively, it may be circular. It is preferable that the hole 23 is formed near the outer side of the multi-beam forming region 204. Although the size of the hole 23 may be smaller than or equal to that of each of a plurality of holes 22, it is preferable that the hole 23 is formed to be larger than the hole 22. By making the size of the hole 23 larger, it becomes possible to increase the size of one side (or diameter size) of a primary guide beam 21 to be described later. Then, by increasing the size of the primary guide beam 21, the generation amount of secondary electrons to be described later can be increased, and thereby, S/N ratio at the time of position detection can be improved. Although FIG. 2 shows the case where the hole 23 is formed at the outside of the upper right corner of the multi-beam forming region 204, it is not limited thereto. Preferably, the hole 23 is formed in the outside region which is along the outer periphery of the multi-beam forming region 204. Although FIG. 2 shows the case of forming one hole 23, it is also preferable to form a plurality of holes 23.

The image acquisition mechanism 150 acquires, using multiple electron beams 20, an inspection image of a figure pattern from the substrate 101 on which figure patterns are formed. Hereinafter, operations of the image acquisition mechanism 150 in the inspection apparatus 100 are described.

The electron beam 200 emitted from the electron gun 201 (emission source) almost perpendicularly (e.g., vertically) illuminates the whole of the shaping aperture array substrate 203 by the illumination lens 202. The shaping aperture array substrate 203, as an example of a beam forming mechanism, forms the multiple beams 20 (multiple primary electron beams) and the primary guide beam 21 (measurement primary electron beam). Specifically, it operates as follows: As shown in FIG. 2, a plurality of quadrangular (rectangular) holes 22 (openings) and at least one hole 23 (opening) are formed in the shaping aperture array substrate 203. The region including all the plurality of holes 22 and the hole 23 is irradiated by the electron beam 200. For example, a plurality of quadrangular primary electron beams (multiple beams) 20a to 20c (solid lines in FIG. 1) are formed by letting portions of the electron beam 200, which irradiate the positions of a plurality of holes 22, individually pass through a corresponding one of the plurality of holes 22 in the shaping aperture array substrate 203. Moreover, for example, a quadrangular primary guide beam 21 (measurement primary electron beam) (solid line in FIG. 1) is formed by letting a portion of the electron beam 200, which irradiates the position of the hole 23, pass through the hole 23 in the shaping aperture array substrate 203. In the example of FIG. 2, since the hole 23 is arranged outside a plurality of holes 22, the primary guide beam 21 is formed outside the multiple beams 20. Formed multiple beams 20a to 20c and the primary guide beam 21 collectively irradiate the surface of the substrate 101 (target object) by the primary electron optical system. Specifically, it operates as follows:

Then, the multiple beams 20a to 20c and the primary guide beam 21 form a crossover (C.O.). After having passed through the beam separator 214 disposed at the crossover position of each beam of the multiple beams 20 and the primary guide beam 21, the multiple beams 20a to 20c are reduced by the reducing lens 205, and travel toward the center hole of the limiting aperture substrate 206. At this stage, when being collectively deflected by the common blanking deflector 212 placed between the shaping aperture array substrate 203 and the reducing lens 205, the multiple beams 20a to 20c and the primary guide beam 21 deviate from the center hole of the limiting aperture substrate 206 so as to be blocked by the limiting aperture substrate 206. On the other hand, the multiple beams 20a to 20c and the primary guide beam 21 which were not deflected by the common blanking deflector 212 pass through the center hole of the limiting aperture substrate 206 as shown in FIG. 1. Blanking control is provided by ON/OFF of the common blanking deflector 212 to collectively control ON/OFF of the beams. Thus, the limiting aperture substrate 206 blocks the multiple beams 20a to 20c and the primary guide beam 21 which were deflected to be in the OFF condition by the common blanking deflector 212. Then, the multiple beams 20a to 20c for inspection and the primary guide beam 21 for deviation guide are formed by the beams having been made during a period from becoming "beam ON" to becoming "beam OFF" and having passed through the limiting aperture substrate 206. The multiple beams 20a to 20c and the primary guide beam 21 having passed through the limiting aperture substrate 206 are focused on the substrate 101 by the objective lens 207 to be a pattern image (beam diameter) of a desired reduction ratio. Then, the whole multiple beams 20 having passed through the limiting aperture substrate 206 are collectively deflected in the same direction by the main deflector 208 and the sub deflector 209 in order to irradiate respective beam irradiation positions on the substrate 101. In such a case, the main deflector 208 collectively deflects all of the multiple beams 20 to the reference position of the mask die to be scanned by the multiple beams 20. According to the first embodiment, scanning is performed while continuously moving the XY stage 105. Therefore, the main deflector 208 performs tracking deflection to follow the movement of the XY stage 105. Then, the sub deflector 209 collectively deflects all of the multiple beams 20 so that each beam may scan a corresponding region. Ideally, the multiple beams 20 irradiating at a time are aligned at the pitch obtained by multiplying the arrangement pitch of a plurality of holes 22 in the shaping aperture array substrate 203 by the desired reduction ratio (1/a) described above. Moreover, with respect to the primary guide beam 21, an image reduced by the same reduction ratio outside the multiple beams 20 is formed on the surface of the substrate 101. Thus, the main electron beam column 102 irradiates the substrate 101 with two-dimensional $m_1 \times n_1$ multiple beams 20 and at least one primary guide beam 21 at a time. High quality is required for the multiple beams 20 in order to observe the image, but high quality is not required for the primary guide beam in order to measure the position of gravity center. A flux of secondary electrons (multiple secondary electrons 300) (dotted lines in FIG. 1) including reflected electrons, corresponding to each beam of the multiple beams 20, is emitted from the substrate 101 due to that desired positions on the substrate 101 are irradiated with the multiple beams 20. Similarly, a secondary guide beam 301 (measurement secondary electron beam) (dotted line in FIG. 1) including a reflected electron, corresponding to the primary guide beam 21, is emitted from the substrate 101 due to that a desired position on the substrate 101 is irradiated with the primary guide beam 21.

The multiple secondary electrons 300 and the secondary guide beam 301 emitted from the substrate 101 are refracted toward the center of the multiple secondary electrons 300 by the objective lens 207, and travel toward the center hole of the limiting aperture substrate 206. The multiple secondary electrons 300 and the secondary guide beam 301 having passed through the limiting aperture substrate 206 are refracted almost parallel to the optical axis by the reducing lens 205, and travel to the beam separator 214.

The beam separator 214 generates an electric field and a magnetic field to be orthogonal to each other in a plane orthogonal to the traveling direction (optical axis) of the multiple beams 20 and the primary guide beam 21. The electric field exerts a force in a fixed direction regardless of the traveling direction of electrons. In contrast, the magnetic field exerts a force according to Fleming's left-hand rule. Therefore, the direction of force acting on electrons can be changed depending on the entering direction of an electron. With respect to the multiple beams 20 (primary electron beams) and the primary guide beam 21 which enter the beam separator 214 from the upper side, since the force due to the electric field and the force due to the magnetic field cancel each other out, the multiple beams 20 and the primary guide beam 21 travel straight downward. On the other hand, with respect to the multiple secondary electrons 300 and the secondary guide beam 301 which enter the beam separator 214 from the lower side, since both the force due to the electric field and the force due to the magnetic field are exerted in the same direction, the multiple secondary electrons 300 and the secondary guide beam 301 are bent obliquely upward.

The multiple secondary electron beams 300 and the secondary guide beam 301 are collectively guided by the secondary electron optical system. Specifically, it operates as follows: The multiple secondary electron beams 300 and the secondary guide beam 301 which have been bent obliquely upward are guided toward the multi-detector 222 side while being refracted by the projection lenses 224 and 226. Then, the guided multiple secondary electron beams 300 are projected onto the multi-detector 222. The multi-detector 222 detects the projected multiple secondary electron beams 300. Similarly, the guided secondary guide beam 301 is projected onto the position detector 223.

Figure 3:
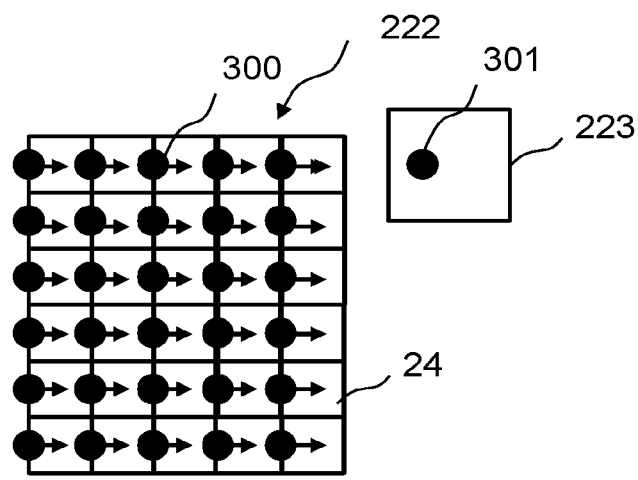
FIG. 3 shows an example of arrangement positional relation between a multi-detector and a position detector according to the first embodiment.

FIG. 3 shows an example of arrangement positional relation between a multi-detector and a position detector according to the first embodiment. In FIG. 3, the multi-detector 222 includes a diode type two-dimensional sensor, for example. In other words, the multi-detector 222 has a plurality of detection surfaces which individually detect the multiple secondary electron beams 300. For example, a plurality of sensor elements are formed dimensionally on one substrate. Then, at the position of the diode type two-dimensional sensor corresponding to each beam of the multiple beams 20, each secondary electron beam of the multiple secondary electron beams 300 collides with a corresponding sensor element of the two-dimensional sensor so as to produce an electron and generate secondary electron image data for each pixel to be described later. Since scanning is performed while continuously moving the XY stage 105, tracking deflection is provided as described above. Being coincident with the movement of the deflection position along with the tracking deflection, the deflector 228 deflects the multiple secondary electron beams 300 so that they may irradiate respective desired positions on the light receiving sensor surfaces 24 (light receiving surface of sensor, detection surface) of a plurality of sensor elements of the multi-detector 222. FIG. 3 shows the case where 5×6 light receiving sensor surfaces 24 are formed as the multi-detector 222. However, it should be understood that the number of formed light receiving sensor surfaces 24 corresponds to the number of beams of the multiple secondary electron beams 300 and thus the number of beams of the multiple beams 20. Moreover, each of a plurality of light receiving sensor surfaces 24 is formed to be coincident with the irradiation position of the corresponding secondary electron beam of the multiple secondary electron beams 300. In that case, deviation (error) may occur due to the disturbance, etc. described above in the positional relationship between the multiple secondary electron beams 300 and a plurality of light receiving sensor surfaces 24 of the multi-detector 222. For example, if there is a change such as inclination of the secondary optical system, the center of brightness (luminance) on the light receiving sensor surface 24 may move. FIG. 3 shows the case where the multiple secondary electron beams 300 shift to the left (−x direction) with respect to a plurality of light receiving sensor surfaces 24 of the multi-detector 222. Thus, deviation occurs due to disturbance, etc., in the trajectory of the multiple beams 20 and/or the multiple secondary electron beams 300. Because of this trajectory deviation, an error occurs at the position (brightness center) of the multiple secondary electron beams 300 detected by the multi-detector 222. Thus, distortion and/or gray scale variation will be generated in an acquired image. Therefore, it is necessary to correct the movement of the brightness center generated due to disturbance, etc. Then, according to the first embodiment, deviation of the beam trajectory of the multiple secondary electron beams 300 is calculated by measuring, by using the position detector 223, the position of the secondary guide beam 301 which has passed through the same beam trajectory as that of the multiple secondary electron beams 300. The position detector 223 is disposed near the multi-detector 222. The position detector 223 detects the position of the secondary guide beam 301 located outside the multiple secondary electron beams 300. It is preferable to dispose the position detector 223 such that the detection surface of the position detector 223 is flush (in the same plane) with that of the multi-detector 222. However, it is not limited thereto. When the position detector 223 is arranged on the surface different from that of the multi-detector 222, the detection result may be converted to the one calculated on the same surface as the detection surface of the multi-detector 222. As the position detector 223, preferably, a PSD (Position Sensitive Detector) sensor is used, for example. By using the PSD sensor, the position of gravity center of the secondary guide beam 301 can be measured. Moreover, the size of the detection surface of the position detector 223 is preferably larger than the size of each of a plurality of light receiving sensor surfaces 24. By making the size of the detection surface of the position detector 223 larger, it becomes possible to measure the direction and amount of positional deviation even when the irradiation position of a secondary electron beam is displaced from each light receiving sensor surface 24.

Figure 4:
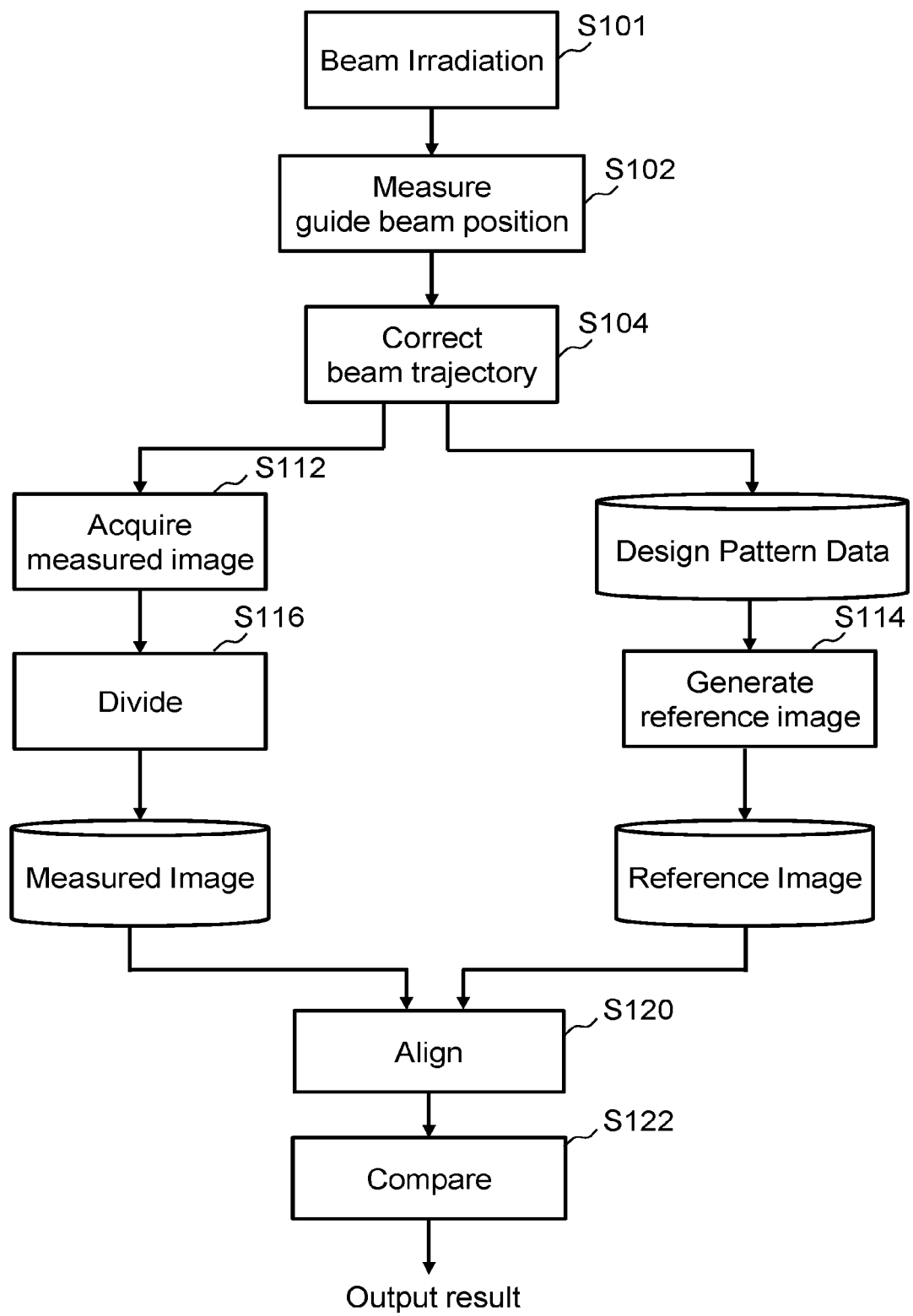
FIG. 4 is a flowchart showing main steps of an inspection method according to the first embodiment.

FIG. 4 is a flowchart showing main steps of an inspection method according to the first embodiment. In FIG. 4, the inspection method of the first embodiment executes a series of steps: a beam irradiation step (S101), a guide beam position measurement step (S102), a beam trajectory correction step (S104), a measured image acquisition step (S112), a reference image generating step (S114), a dividing step (S116), an alignment step (S120), and a comparison step (S122). In the steps described above, the beam irradiation step (S101), the guide beam position measurement step (S102), the beam trajectory correction step (S104), and the measured image acquisition step (S112) correspond to the image acquisition method of the first embodiment.

In the beam irradiation step (S101), the image acquisition mechanism 150 irradiates the substrate 101 with figure patterns formed thereon, by the multiple electron beams 20 and the primary guide beam 21. Specifically, as described above, the multiple beams 20 (multiple primary electron beams) and the primary guide beam 21 (measurement primary electron beam) are formed through the shaping aperture array substrate 203 under the control of the control computer 110. Then, the primary electron optical system collectively irradiates the surface of the substrate 101 with the multiple beams 20 and the primary guide beam 21.

In the guide beam position measurement step (S102), as described above, the image acquisition mechanism 150 guides, towards the multi-detector 222, the multiple secondary electron beams 300 generated because the substrate 101 is irradiated with the multiple beams 20, and the secondary guide beam 301 generated because the substrate 101 is irradiated with the primary guide beam 21. Specifically, as described above, the beam trajectories of the multiple secondary electron beams 300 and the secondary guide beam 301 are bent towards the sub electron beam column 104 by the beam separator 214. Then, in the sub electron beam column 104, the multiple secondary electron beams 300 and the secondary guide beam 301 are collectively guided by the secondary electron optical system. The guided multiple secondary electron beams 300 are projected onto the multi-detector 222. The guided secondary guide beam 301 is projected onto the position detector 223. The position detector 223 (an example of the measurement mechanism) measures the position of the secondary guide beam 301 by detecting its position. Information on the position of the secondary guide beam 301 detected by the position detector 223 is output to the position measurement circuit 132. Based on this information, the position measurement circuit 132 (an example of the measurement mechanism) measures the position of the secondary guide beam 301 which has been collectively guided with the multiple secondary electron beams 300.

In the beam trajectory correction step (S104), using the measured position of the secondary guide beam 301, the correction circuit 130 calculates a correction amount for correcting the trajectory of the multiple secondary electron beams 300. For example, the correction circuit 130 calculates a deflection amount used for correcting the positional deviation amount of the secondary guide beam 301 deviated from the design position. The calculated correction amount is output to the deflection control circuit 128. The deflection control circuit 128 adds the correction amount, as an offset amount, to the deflection data of the deflector 228. Then, the deflector 228 (an example of the correction mechanism) controlled by the deflection control circuit 128 corrects the trajectory of the multiple secondary electron beams 300. Thus, the deflector 228 corrects the trajectory of the multiple secondary electron beams 300 by using the measured position of the secondary guide beam 301. By this correction, the trajectory is corrected such that each of the multiple secondary electron beams 300 enters a desired light receiving sensor surface 24 of the multi-detector 222. Furthermore, by performing trajectory correction of the multiple secondary electron beams 300, it becomes possible to correct relative deviation between the substrate 101 and the multi-detector 222 which is not caused by deviation of a primary electron beam.

As described above, the correction mechanism includes the deflector 228. However, trajectory correction of the multiple secondary electron beams 300 is not limited to the case performed by the deflector 228. For example, the calculated correction amount may be output to the lens control circuit 124. In that case, the lens control circuit 124 corrects the trajectory of the multiple secondary electron beams 300 by controlling the alignment coil 229. Thus, the alignment coil 229 corrects the trajectory of the multiple secondary electron beams 300 by using the measured position of the secondary guide beam 301. By this correction, the trajectory is corrected such that each of the multiple secondary electron beams 300 enters a desired light receiving sensor surface 24 of the multi-detector 222. Thus, it is also preferable that the correction mechanism includes the alignment coil 229.

In the measured image acquisition step (S112), the image acquisition mechanism 150 acquires the image of a figure pattern formed on the surface of the substrate 101 in the state of the trajectory of the multiple secondary electron beams 300 having been corrected.

Figure 5:
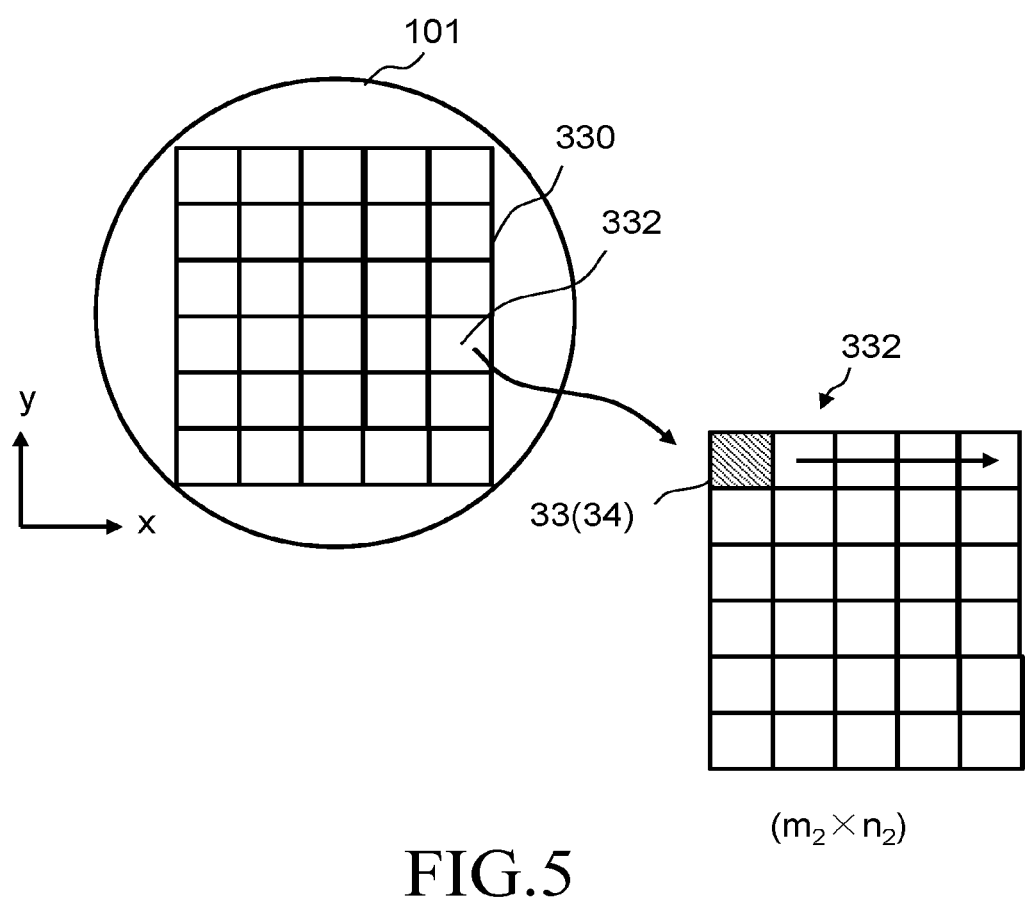
FIG. 5 shows an example of a plurality of chip regions formed on a semiconductor substrate according to the first embodiment.

FIG. 5 shows an example of a plurality of chip regions formed on a semiconductor substrate of the first embodiment. In FIG. 5, in the case of the substrate 101 being a semiconductor substrate (wafer), a plurality of chips (wafer die) 332 in a two-dimensional array are formed in an inspection region 330 of the semiconductor substrate (wafer). A mask pattern for one chip formed on the exposure mask substrate is reduced to ¼, for example, and exposed/transferred onto each chip 332 by an exposure device (stepper) (not shown). The inside of each chip 332 is divided into a plurality of mask dies 33 of $m_2$ columns wide (width in the x direction) and $n_2$ rows long (length in the y direction) (each of $m_2$ and $n_2$ is an integer of 2 or greater), for example. In the first embodiment, the mask die 33 serves as a unit inspection region.

Figure 6:
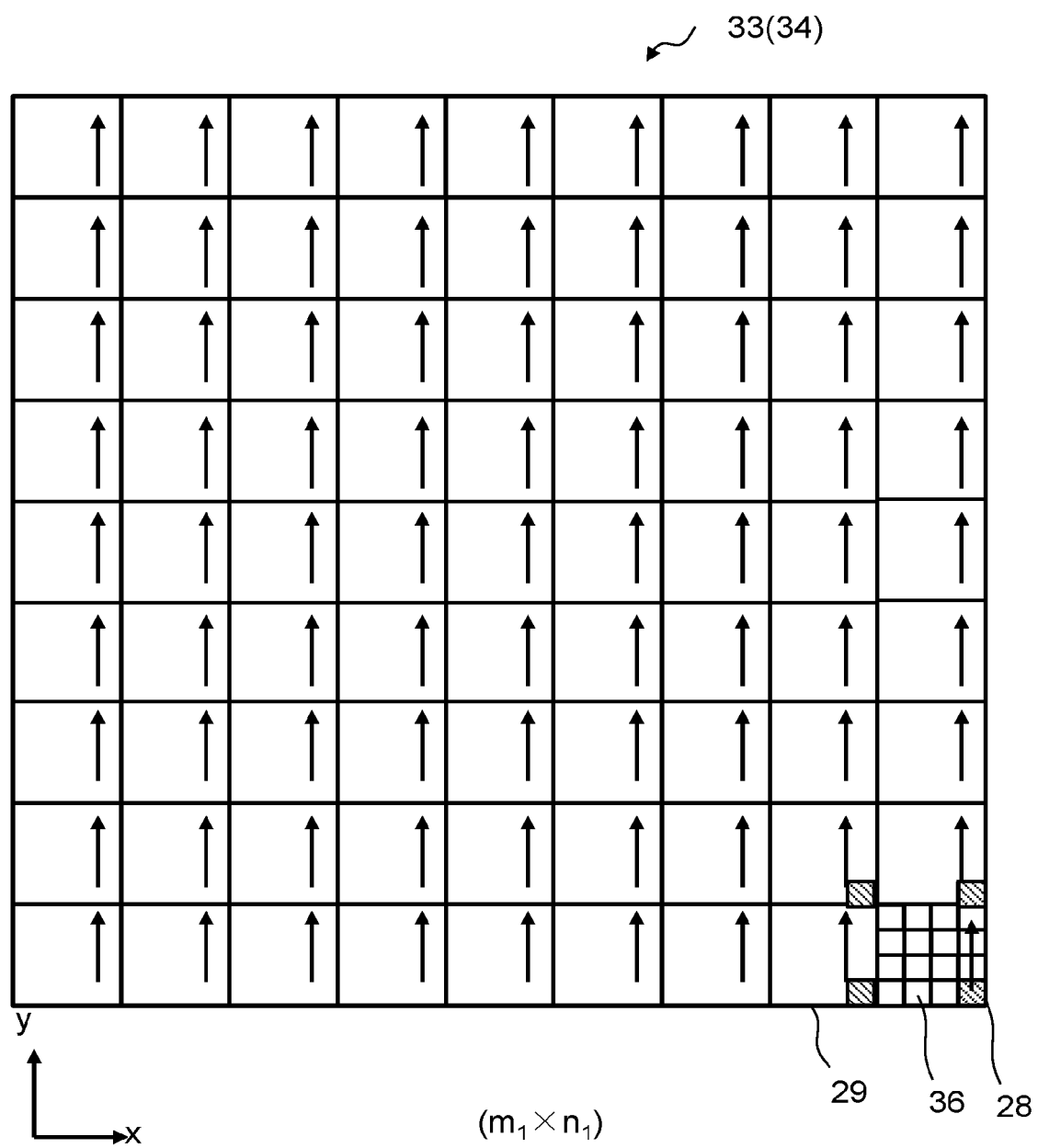
FIG. 6 shows an example of an irradiation region and a measurement pixel of multiple beams according to the first embodiment.

FIG. 6 shows an example of an irradiation region and a measurement pixel of multiple beams according to the first embodiment. In FIG. 6, each mask die 33 is divided into a plurality of mesh regions by the size of each beam of multiple beams, for example. Each mesh region serves as a measurement pixel 36 (unit irradiation region). FIG. 6 illustrates the case of multiple beams of 8×8 (rows by columns). The size of the irradiation region 34 that can be irradiated with one irradiation of the multiple beams 20 is defined by (x direction size obtained by multiplying pitch between beams in x direction of the multiple beams 20 by the number of beams in the x direction on the substrate 101)×(y direction size obtained by multiplying pitch between beams in y direction of the multiple beams 20 by the number of beams in the y direction on the substrate 101). In the case of FIG. 6, the irradiation region 34 and the mask die 33 are of the same size. However, it is not limited thereto. The irradiation region 34 may be smaller than the mask die 33, or larger than it. In the irradiation region 34, there are shown a plurality of measurement pixels 28 (irradiation positions of beams of one shot) which can be irradiated with one irradiation of the multiple beams 20. In other words, the pitch between adjacent measurement pixels 28 serves as the pitch between beams of the multiple beams. In the case of FIG. 6, one sub-irradiation region 29 is a square region surrounded at four corners by four adjacent measurement pixels 28, and including one of the four measurement pixels 28. In the example of FIG. 6, each sub-irradiation region 29 is composed of 4×4 pixels 36.

In the scanning operation according to the first embodiment, scanning is performed for each mask die 33. FIG. 6 shows the case of scanning one mask die 33. When all of the multiple beams 20 are used, there are arranged $m_1 \times n_1$ sub-irradiation regions 29 in the x and y directions (two-dimensionally) in one irradiation region 34. The XY stage 105 is moved to a position where the first mask die 33 can be irradiated with the multiple beams 20. Then, while the main deflector 208 is performing tracking deflection so as to follow the movement of the XY stage 105, the sub deflector 209 scans, in the state of being tracking-deflected, the inside of the mask die 33 concerned being regarded as the irradiation region 34. Each beam of the multiple beams 20 is associated with any one of the sub-irradiation regions 29 which are different from each other. At the time of each shot, each beam irradiates one measurement pixel 28 corresponding to the same position in the associated sub-irradiation region 29. In the case of FIG. 6, the sub deflector 209 performs deflection such that the first shot of each beam irradiates the first measurement pixel 36 from the right in the bottom row in the sub-irradiation region 29 concerned. Thus, irradiation of the first shot is performed. Then, the beam deflection position is shifted in the y direction by the amount of one measurement pixel 36 by collectively deflecting all of the multiple beams 20 by the sub deflector 209, and the second shot irradiates the first measurement pixel 36 from the right in the second row from the bottom in the sub-irradiation region 29 concerned. Similarly, the third shot irradiates the first measurement pixel 36 from the right in the third row from the bottom in the sub-irradiation region 29 concerned. The fourth shot irradiates the first measurement pixel 36 from the right in the fourth row from the bottom in the sub-irradiation region 29 concerned. Next, the beam deflection position is shifted to the second measurement pixel 36 from the right in the bottom row by collectively deflecting all of the multiple beams 20 by the sub deflector 209. Similarly, the measurement pixels 36 are irradiated in order in the y direction. By repeating this operation, one beam irradiates all the measurement pixels 36 in order in one sub-irradiation region 29. By performing one shot, the multiple secondary electrons 300 corresponding to a plurality of shots whose maximum number is the same as the number of a plurality of holes 22 are detected at a time by the multiple beams formed by passing through the plurality of holes 22 in the shaping aperture array substrate 203.

As described above, the whole multiple beams 20 scans the mask die 33 as the irradiation region 34, and that is, each beam individually scans one corresponding sub-irradiation region 29. After scanning one mask die 33 is completed, the irradiation region 34 is moved to a next adjacent mask die 33 in order to scan the next adjacent mask die 33. This operation is repeated to proceed scanning of each chip 332. Due to shots of the multiple beams 20, secondary electrons are emitted from the irradiated measurement pixels 36 at each shot time, and detected by the multi-detector 222. According to the first embodiment, the multi-detector 222 detects the secondary electron beam emitted upward from each measurement pixel 36, for each measurement pixel 36 (or each sub-irradiation region 29) which is a unit detection region of the multi-detector 222.

By performing scanning using the multiple beams 20 as described above, the scanning operation (measurement) can be performed at a speed higher than that of scanning by a single beam. The scanning of each mask die 33 may be performed by the "step and repeat" operation, alternatively it may be performed by continuously moving the XY stage 105. When the irradiation region 34 is smaller than the mask die 33, it will suffice to perform the scanning operation while moving the irradiation region 34 in the mask die 33 concerned.

When the substrate 101 is an exposure mask substrate, the chip region for one chip formed on the exposure mask substrate is divided into a plurality of stripe regions in a strip form by the size of the mask die 33 described above, for example. Then, for each stripe region, scanning is performed for each mask die 33 in the same way as described above. Since the size of the mask die 33 on the exposure mask substrate is the size before being transferred and exposed, it is four times the mask die 33 on the semiconductor substrate. Therefore, if the irradiation region 34 is smaller than the mask die 33 on the exposure mask substrate, the scanning operation for one chip increases (e.g., four times). However, since a pattern for one chip is formed on the exposure mask substrate, the number of times of scanning can be less compared to the case of the semiconductor substrate on which more than four chips are formed.

As described above, using the multiple beams 20, the image acquisition mechanism 150 scans the substrate 101 to be inspected, on which a figure pattern is formed, and detects the multiple secondary electron beams 300 emitted from the inspection substrate 101 due to it being irradiated with the multiple beams 20. Detected data on a secondary electron (measured image: secondary electron image: inspection image to be inspected) from each measurement pixel 36 detected by the multi-detector 222 is output to the detection circuit 106 in order of measurement. In the detection circuit 106, the detected data in analog form is converted into digital data by an A-D converter (not shown), and stored in the chip pattern memory 123. Thus, the image acquisition mechanism 150 acquires a measured image of a pattern formed on the substrate 101. Then, for example, when the detected data for one chip 332 has been accumulated, the accumulated data is transmitted as chip pattern data to the comparison circuit 108, with information data on each position from the position circuit 107.

In the reference image generating step (S114), based on design data serving as a basis for forming a pattern on the substrate 101, or design pattern data defined in exposure image data of a pattern formed on the substrate 101, the reference image generation circuit 112 generates a reference image for each mask die. Specifically, it operates as follows: First, design pattern data is read from the storage device 109 through the control computer 110, and each figure pattern defined in the read design pattern data is converted into image data of binary or multiple values.

Here, basics of figures defined by design pattern data are, for example, rectangles and triangles. For example, there is stored figure data defining the shape, size, position, and the like of each pattern figure by using information, such as coordinates (x, y) of the reference position of the figure, lengths of sides of the figure, and a figure code serving as an identifier for identifying the figure type such as a rectangle, a triangle and the like.

When design pattern data, used as figure data, is input to the reference image generation circuit 112, the data is developed into data of each figure. Then, the figure code, the figure dimensions and the like indicating the figure shape in the data of each figure are interpreted. Then, the reference image generation circuit 112 develops each figure data to design pattern image data of binary or multiple values as a pattern to be arranged in a mesh region in units of grids of predetermined quantization dimensions, and outputs the developed data. In other words, the reference image generation circuit 112 reads design data, calculates an occupancy rate occupied by a figure in the design pattern, for each mesh region obtained by virtually dividing an inspection region into grid squares in units of predetermined dimensions, and outputs n-bit occupancy rate data. For example, it is preferable that one mesh region is set as one pixel. Assuming that one pixel has a resolution of $1/2^8 (=1/256)$, the occupancy rate in each pixel is calculated by allocating small regions which correspond to the region of figures arranged in the pixel concerned and each of which is corresponding to a $1/256$ resolution. Then, 8-bit occupancy rate data is output to the reference circuit 112. The mesh region (inspection pixel) may be in accordance with the pixel of measured data.

Next, the reference image generation circuit 112 performs appropriate filter processing on design image data of a design pattern which is image data of a figure. Since optical image data as a measured image is in the state affected by filtering performed by the optical system, in other words, in the analog state continuously changing, it is possible to match/fit the design image data with the measured data by also applying a filtering process to the design image data being image data on the design side whose image intensity (gray value) is represented by digital values. The generated image data of a reference image is output to the comparison circuit 108.

Figure 7:
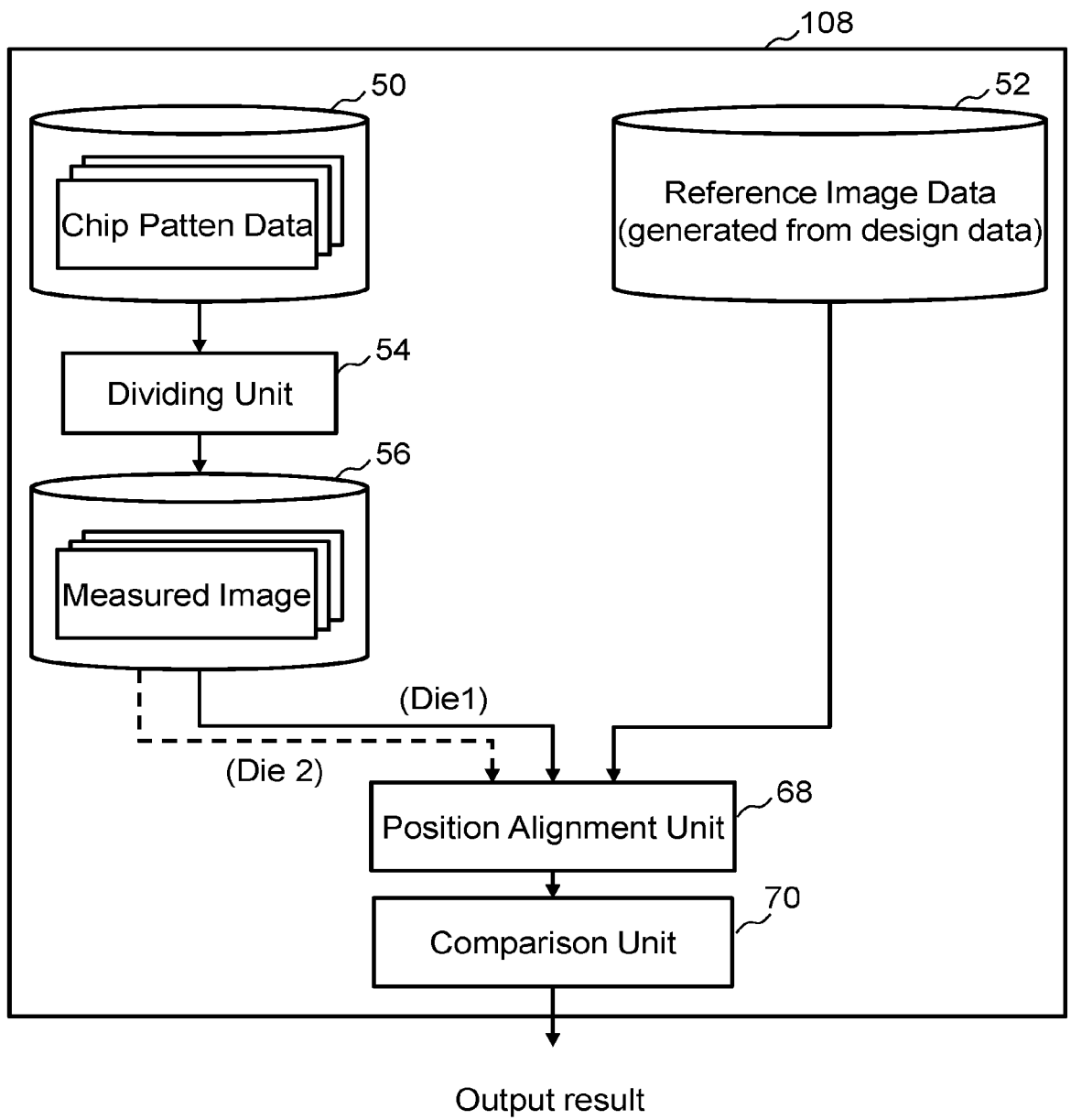
FIG. 7 shows an internal configuration of a comparison circuit according to the first embodiment.

FIG. 7 shows an internal configuration of a comparison circuit according to the first embodiment. In FIG. 7, storage devices 50, 52 and 56, such as magnetic disk drives, a dividing unit 54, an alignment unit 68, and a comparison unit 70 are arranged in the comparison circuit 108. Each of the "units" such as the dividing unit 54, the alignment unit 68, and the comparison unit 70 includes a processing circuitry. As the processing circuitry, for example, an electric circuit, computer, processor, circuit board, quantum circuit, semiconductor device, or the like can be used. Each of the "units" may use a common processing circuitry (same processing circuitry), or different processing circuitries (separate processing circuitries). Information input and output to/from the dividing unit 54, the alignment unit 68, and the comparison unit 70, and information being operated are stored in a memory (not shown) or in the memory 118 each time.

The measured chip pattern data is stored in the storage device 50. The generated image data of the reference image is stored in the storage device 52.

In the dividing step (S114), the dividing unit divides the image of a chip pattern defined by chip pattern data into images of a plurality of mask dies 33 each serving as a unit of inspection. The divided image (measurement image) of the mask die 33 is stored in the storage device 56.

In the alignment step (S120), the alignment unit 68 provides alignment (positioning) between a mask die image serving as an inspection image, and a mask die image serving as a reference image. For example, the alignment is provided using a least-squares method.

In the comparison step (S122), the comparison unit 70 compares a measured image measured from the substrate 101 with a corresponding reference image. Specifically, a position-aligned inspection image and a reference image are compared with each other for each pixel. The comparison between them is performed for each pixel according to predetermined determination conditions, using a predetermined determination threshold value, in order to determine, for example, whether there is a defect such as a shape defect. For example, if a gray scale value difference for each pixel is larger than a determination threshold value Th, it is determined to be a candidate defect. Then, the comparison result is output, and specifically, may be output to the storage device 109, monitor 117, or memory 118, or alternatively, output from the printer 119.

Instead of the die-to-database inspection described above, the die-to-die inspection may be performed. In the case of the die-to-die inspection, data of measured images obtained by imaging identical patterns at different positions on the same substrate 101 are compared. Therefore, from the substrate 101 on which identical patterns (first and second figure patterns) are formed at different positions, the image acquisition mechanism 150 acquires, using the multiple beams 20 (electron beams), measured images being secondary electron images one of which corresponds to the figure pattern (first figure pattern) and the other of which corresponds to the other figure pattern (second figure pattern). In that case, one of the acquired measured images of the figure patterns is treated as a reference image, and the other one is treated as an inspection image. The acquired images of the figure pattern (first figure pattern) and the other figure pattern (second figure pattern) may be in the same chip pattern data, or indifferent chip pattern data. The method for inspection may be the same as that of the die-to-database inspection.

Now regarding the secondary guide beam 301, since it is always generated together with the multiple secondary electron beams 300 during the multiple secondary electron beams 300 being generated, the position detector 223 can always measure the secondary guide beam 301 during the measured image acquisition step (S112) for inspection. In other words, the guide beam position measurement step (S102) can be always performed during the measured image acquisition step (S112). Therefore, in the case where the position of the secondary guide beam 301 shifts from the threshold during acquiring a measured image for inspection, it is also preferable to perform trajectory correction of the multiple secondary electron beams 300 in real time each time. However, note that it is preferable to perform the trajectory correction in units of chips 332 or units of mask dies 33 in order not to produce distortion, which is due to the trajectory correction of the multiple secondary electron beams 300, in the image being detected by the multi-detector 222. Alternatively, in the case where the disturbance detection circuit 134 detects a change of a measurement disturbance that has exceeded a pre-set threshold, it is also preferable to perform the beam irradiation step (S101), the guide beam position measurement step (S102), and the beam trajectory correction step (S104) for correcting the trajectory of the multiple secondary electron beams 300. Particularly, since atmospheric-pressure change, temperature change, and the like are disturbance factors which are difficult to change rapidly, the beam irradiation step (S101), the guide beam position measurement step (S102), and the beam trajectory correction step (S104) may be performed when the disturbance detection circuit 134 detects the change exceeding the threshold.

As described above, according to the first embodiment, it is possible to highly accurately perform detection by the multi-detector when acquiring an image by using multiple beams. Therefore, it is possible to obtain an image in which distortion and gray scale change have been suppressed or reduced.

In the above description, each " . . . circuit" includes a processing circuitry. As the processing circuitry, for example, an electric circuit, computer, processor, circuit board, quantum circuit, semiconductor device, or the like can be used. Each " . . . circuit" may use a common processing circuitry (same processing circuitry), or different processing circuitries (separate processing circuitries). A program for causing a processor to execute processing may be stored in a recording medium, such as a magnetic disk drive, magnetic tape drive, FD, ROM (Read Only Memory), etc. For example, the position circuit 107, the comparison circuit 108, the reference image generation circuit 112, the correction circuit 130, etc. may be configured by at least one processing circuitry described above.

Embodiments have been explained referring to specific examples described above. However, the present invention is not limited to these specific examples. For example, similar correction can be implemented with respect to influence due to charging to the secondary optical system, or magnetic field variation of the secondary optical system, etc.

While the apparatus configuration, control method, and the like not directly necessary for explaining the present invention are not described, some or all of them can be selectively used on a case-by-case basis when needed.

In addition, any other multiple beam image acquisition apparatus, multiple beam image acquisition method, pattern inspection apparatus, and pattern inspection method that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A multiple beam image acquisition apparatus comprising:
a stage configured to mount thereon a target object;
a beam forming mechanism configured to form multiple primary electron beams and a measurement primary electron beam;

a primary electron optical system configured to irradiate a surface of the target object with the multiple primary electron beams and the measurement primary electron beam;

a secondary electron optical system configured to guide multiple secondary electron beams generated resulting from the target object being irradiated with the multiple primary electron beams, and a measurement secondary electron beam generated resulting from the target object being irradiated with the measurement primary electron beam;

a multi-detector configured to detect guided multiple secondary electron beams, wherein the multi-detector includes a plurality of detection surfaces which detect the multiple secondary electron beams;

a measurement mechanism configured to measure a position of a guided measurement secondary electron beam, wherein the measurement mechanism includes:
    a position detector configured to detect the position of the measurement secondary electron beam, and
    a position measurement circuit configured to measure the position of the measurement secondary electron beam by information on the position of the measurement secondary electron beam detected by the position detector; and a correction mechanism including a deflector, configured to correct a trajectory of the multiple secondary electron beams by the deflector by a measured position of the measurement secondary electron beam, wherein an image of a pattern on the target object is formed based on the multiple secondary electron beams detected by the multi-detector and a detection surface of the position detector is larger than each of the plurality of detection surfaces of the multi-detector.

2. The apparatus according to claim 1, wherein the measurement primary electron beam is formed outside the multiple primary electron beams.

3. The apparatus according to claim 1, wherein the position detector is disposed near the multi-detector.

4. The apparatus according to claim 1, wherein the position detector detects the position of the measurement secondary electron beam located outside the multiple secondary electron beams.

5. The apparatus according to claim 1, wherein the position detector is disposed such that a detection surface of the position detector is flush with a detection surface of the multi-detector.

6. A multiple beam image acquisition apparatus comprising:
    a stage configured to mount thereon a target object;
    a beam forming mechanism configured to form multiple primary electron beams and a measurement primary electron beam;
    a primary electron optical system configured to irradiate a surface of the target object with the multiple primary electron beams and the measurement primary electron beam;
    a secondary electron optical system configured to guide multiple secondary electron beams generated resulting from the target object being irradiated with the multiple primary electron beams, and a measurement secondary electron beam generated resulting from the target object being irradiated with the measurement primary electron beam;
    a multi-detector configured to detect guided multiple secondary electron beams, wherein the multi-detector includes a plurality of detection surfaces which detect the multiple secondary electron beams;
    a measurement mechanism configured to measure a position of a guided measurement secondary electron beam, wherein the measurement mechanism includes:
        a position detector configured to detect the position of the measurement secondary electron beam, and
        a position measurement circuit configured to measure the position of the measurement secondary electron beam by information on the position of the measurement secondary electron beam detected by the position detector; and
    a correction mechanism including an alignment coil, configured to correct a trajectory of the multiple secondary electron beams by the alignment coil by a measured position of the measurement secondary electron beam,
    wherein an image of a pattern on the target object is formed based on the multiple secondary electron beams detected by the multi-detector and a detection surface of the position detector is larger than each of the plurality of detection surfaces of the multi-detector.

7. The apparatus according to claim 6, wherein the measurement primary electron beam is formed outside the multiple primary electron beams.

8. The apparatus according to claim 6, wherein the position detector is disposed near the multi-detector.

9. The apparatus according to claim 6, wherein the position detector detects the position of the measurement secondary electron beam located outside the multiple secondary electron beams.

10. The apparatus according to claim 6, wherein the position detector is disposed such that a detection surface of the position detector is flush with a detection surface of the multi-detector.

* * * * *